PTH41 XR 4,322,877

SR

United States Patent [19] [11] 4,322,877
Taylor [45] Apr. 6, 1982

[54] METHOD OF MAKING PIEZOELECTRIC POLYMERIC ACOUSTIC TRANSDUCER

[75] Inventor: Allen L. Taylor, Woodbury, Minn.

[73] Assignee: Minnesota Mining and Manufacturing Company, Saint Paul, Minn.

[21] Appl. No.: 114,239

[22] Filed: Jan. 22, 1980

Related U.S. Application Data

[63] Continuation of Ser. No. 944,207, Sep. 20, 1978, abandoned.

[51] Int. Cl.$^3$ .............. H01L 41/22
[52] U.S. Cl. .............. 29/25.35; 29/594
[58] Field of Search .............. 29/25.35, 594; 310/330, 310/331, 332, 800; 179/110 A

[56] References Cited

U.S. PATENT DOCUMENTS

| | | | |
|---|---|---|---|
| 3,750,127 | 7/1973 | Ayers et al. | 310/330 X |
| 3,798,474 | 3/1974 | Cassand et al. | 310/331 |
| 3,832,580 | 8/1974 | Yamamuro et al. | 179/110 A X |
| 3,903,733 | 9/1975 | Murayama et al. | 310/800 X |

*Primary Examiner*—Carl E. Hall
*Attorney, Agent, or Firm*—Cruzan Alexander; Donald M. Sell; Richard Francis

[57] ABSTRACT

A method of making a polymeric piezoelectric acoustic transducer tape that is thin enough to be stored in roll form and adapted for placement on a lengthy supportive surface is disclosed. A piezoelectric film is heat-formed to provide a plurality of repetitively curved portions therein, conductive electrodes are applied on opposite surfaces of the curved film, a long, narrow layer of flexible, resilient material is adhered to one surface of the curved film and one or more adhesive portions are applied to the surface of the resilient material.

7 Claims, 4 Drawing Figures

METHOD OF MAKING PIEZOELECTRIC POLYMERIC ACOUSTIC TRANSDUCER

This is a continuation of application Ser. No. 944,207 filed Sep. 20, 1978, now abandoned.

The present invention relates to a method of making polymeric piezoelectric transducers and particularly to flexible polymeric piezoelectric acoustic transducer tapes that are thin enough to be stored in roll form and adapted for placement on lengthy supportive surface. In particular, the present invention relates to acoustic loud speakers and more specifically to a flexible acoustic loud speaker tape that utilizes a speaker element having a piezoelectric layer.

The piezoelectric effect in thin high polymer films by means of uniaxial orientation and subsequent electrical polarization has been known since about 1968. In U.S. Pat. No. 4,056,742 the unusual mechanical characteristics of these films which can limit their usefulness as practical electroacoustic transducers are discussed along with some prior solutions. A review of all of the prior art solutions reveals that each provides a mechanical bias by one means or another. The support frame as set forth in U.S. Pat. No. 4,056,742 is yet another means of providing elastic stability to the piezoelectric film.

Other piezoelectric loud-speaker elements are described in Ohnuki et al., U.S. Pat. No. 3,816,774, and in Yamamuro et al., U.S. Pat. No. 3,832,580. These patents and articles entitled "Electroacoustic Transducers with Piezoelectric High Polymer Films" by Tamura et al., Journal of the Audio Engineering Society, Vol. 23, No. 1, January/February 1975 and "Piezoelectric Headphones" by Martin Clifford, Audio Magazine, May 1975, show discrete, rigidly mounted piezoelectric speaker elements.

No transducer structures have been disclosed in which high polymer piezoelectric films are used without rigid mechanical support so that they are adaptable to storage in roll form. It is accordingly an object of this invention to provide a flexible piezoelectric acoustic transducer in sheet or web form.

In accordance with objects of the invention there is provided a method of making a polymeric piezoelectric acoustic transducer in tape form that is thin enough to be wound on itself in roll form and, when extended, is adapted for placement on lengthy supportive surface. The active transducer elements of the piezoelectric acoustic transducer tape of the invention require no rigid mechanical supportive means. The transducer tape is easy and inexpensive to install, provides a low profile transducer and provides excellent distribution of acoustic production or reception.

The method of making a transducer tape according to the present invention comprising a plurality of repetitive curved segments comprises:

I. heat forming a long, narrow, thin, flexible layer of poled piezoelectric thermoplastic film material having two extended surfaces and a poled direction generally perpendicular to said extended surfaces of said film material on a surface having a plurality of repetitively curved elements disposed in an area corresponding to one of said extended surfaces to provide a comparable plurality of repetitively curved segments in said film.

II. applying first and second continuous, long, narrow, thin, flexible conductive electrodes in surface-to-surface contact with respective sides of said piezoelectric film;

III. adhering to said first extended surface in at least a plurality of positions a long, narrow layer of flexible, resilient material; and IV. applying one or more adhesive portions to at least a portion of said second extended surface of said resilient material.

The second electrode of the piezoelectric transducer element is juxtaposed with and attached at at least a plurality of intervals to a first surface of the flexible, resilient material. A second surface of the flexible resilient material (opposite its first surface) has one or more adhesive portions disposed thereon for attaching the transducer tape to a lengthy supportive surface.

Suitable sheet material for the piezoelectric transducer elements used in the transducer tapes of the invention include poled biaxially oriented poly(vinylidene fluoride) film material as described in Example 1 of U.S. Pat. No. 4,089,034. Other examplary materials are described in U.S. Pat. No. 4,067,056 and 4,079,437. Numerous other materials are also available and can be used alternatively.

Suitable foam materials include flexible urethane foams prepared from polyisocyanates with functionality of two to three and hydroxyl-terminated linear or only slightly branched polyethers or polyesters. Foams based on polymeric isocyanates (4,4'-diphenylmethane diisocyanate analogs with a functionality between two and three) and polyols with higher molecular weights (from 3,000 to 6,500 and capped with primary hydroxyl groups) are preferred because they are essentially cold cured and require no external heat.

Adhesives include compositions which generally contain a film-forming acrylate or elastomeric material, one of several types of natural or synthetic or rubber, and polymeric or resinous materials to impart the desired degree of tack, wetting power and specific adhesion. Numerous such adhesive compositions are available.

Having described the invention broadly it is now described by means of the drawings wherein FIG. 1 shows a roll of piezoelectric acoustic transducer tape of the invention convolutely wound upon itself.

Figure 1:
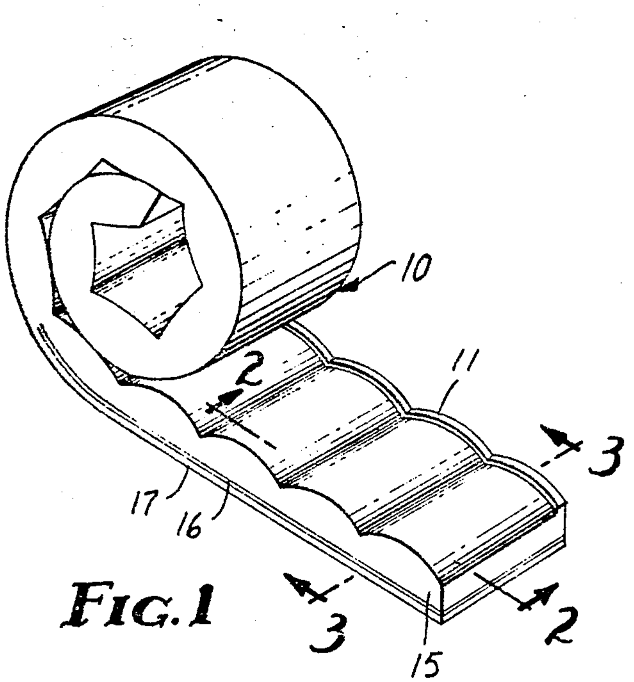
Figure 2:
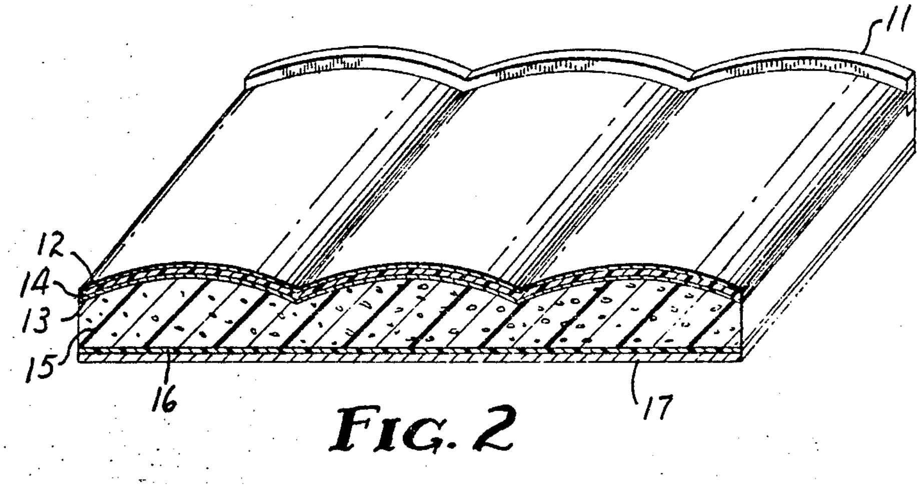
FIG. 2 shows a sectional view at 2—2 of the structure of the piezoelectric acoustic transducer tape of FIG. 1.
Figure 3:
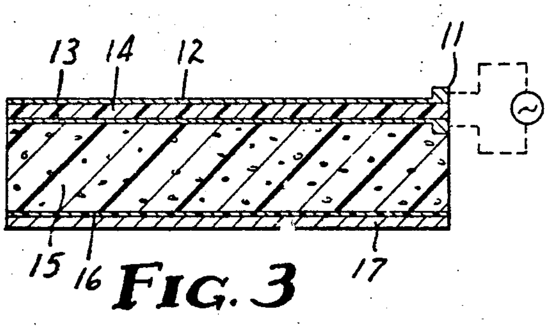
FIG. 3 shows a sectional view at 3—3 of the structure of the piezoelectric acoustic transducer tape of FIG. 1.

Referring again to the drawings it will be seen that the embodiment of the invention shown in FIG. 1 is in the form of a convolutely wound roll of transducer tape (10) which can be of any desired length. The desired length cut from the stored roll and applied to a suitable rigid support member. Electrical connections are made conventionally to a driving or receiving circuit. The electrical elements are omitted from the figures for clarity of illustration.

In the embodiment of the invention shown in FIG. 1, the transducer tape (10) consists of a long, narrow, thin, flexible layer of poled piezoelectric film material (14) having a poled direction generally perpendicular to the broad surfaces of the film, two conductive electrodes (12, 13) deposited on the two broad surfaces of the film and a polyester urethane foam (15) having one face with a plurality of repetitive curved surfaces disposed along its length adhesively attached to one of said conductive electrodes and adhesive (16) with releasable covering (17) on the other face.

Electrodes (12, 13) are thin conductive electrodes on respective faces of poled piezoelectric film (14) and are conveniently produced by conventional vacuum deposition of aluminum. It will be evident that other conductive metals are also satisfactory. Along edge (11) of film (14) electrodes (12, 13) are made substantially thicker to provide a low resistance conductor lengthwise of film (14). The piezoelectric film (14) is biaxially stretched polyvinylidene fluoride film having a thickness of 50 microns and is commercially available from Kureha Kagakee Kogyo Kabushiki Kaisha of Tokyo, Japan. Electrodes (12, 13) also function as charge carriers so that the piezoelectric material can be poled by applying an appropriate voltage potential to them by any desired process such as set forth in patents cited above. Electrode (13) is conveniently held in surface-to-surface contact with the curved surface of the polyester urethane resilient foam (15) by means of an adhesive. Many such are available commercially. Alternatively, resilient foam (15) may be formed in contact with the electrode (13) by application of a liquid polymeric foaming material that cures in air or by the application of heat or light. It is found that an advantage of foaming in place is that the foam adheres to electrode (13) without the necessity for an adhesive. Resilient foam (15) can be cut in the proper configuration from stock material or an appropriate frame can be constructed onto which film (14) with electrodes (12, 13) is conformed prior to formation of foam (15).

Adhesive (16) may be of any convenient type which is compatible with the foam backing such as a pressure sensitive adhesive. It is advantageously protected until needed by backing or release paper (17).

When it is desired to transduce an electrical signal to an acoustical signal or an acoustical signal to an electrical signal, an appropriate length of transducer tape is removed from the roll (10) and adhesively applied to a rigid supportive surface. Subsequently, the electrodes (12, 13) are electrically connected either to an apparatus for producing or receiving an electrical signal. Additionally, if desired, with the incorporation of switching devices and appropriate electronic circuitry, a sending and receiving device such as an intercom can be constructed using the same section of transducer tape.

Figure 4:
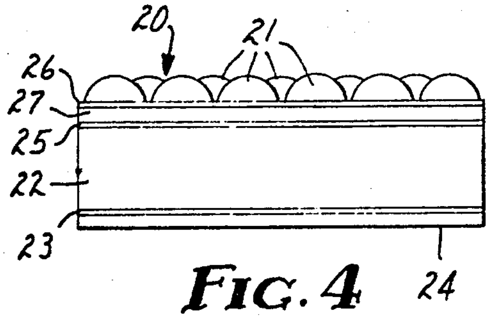
FIG. 4 shows another embodiment of the piezoelectric acoustic transducer tape according to this invention.

FIG. 4 shows an alternative embodiment (20) of the invention. In this embodiment numerous small rounded domes are provided rather than the simple curves as shown above. A thin flexible layer of poled piezoelectric film material having a poled direction generally perpendicular to the broad surfaces of the film and with two conductive electrodes deposited on the broad surfaces is selected as above. The domed structures are conveniently produced by placing the flexible film on top of a close-packed, single layer of 1.27 cm glass balls retained on a porous platten. Suction is applied so that a force of about one atmosphere forces the film against the balls and the assembly is heated in an oven at 90° C. for about 15 minutes. Under these conditions the film softens and is pushed down around the glass balls to form a multiplicity of domed surfaces disposed along its length and width. Removal of the combination from the furnace and air cooling causes the domed surfaces (21) to be permanent.

In this embodiment (20) it is preferred that the resilient foam (22) be formed in place as described above. Pressure sensitive adhesive (23) and release paper (24) are attached to the lower broad surface of resilient foam material (22) as described above. Electrical signal input or output is facilitated by using electrodes (25) and (26) on film material (27).

What is claimed is:

1. A method of making a flexible piezoelectric acoustic transducer tape which is thin enough to be convolutely wound on itself in roll form and when extended is adapted for placement on a lengthy supportive surface, said method comprising:

I. heat forming a long, narrow, thin, flexible layer of poled piezoelectric thermoplastic film material having two extended surfaces and a poled direction generally perpendicular to said extended surfaces of said film on a surface having a plurality of repetitively curved elements disposed in an area corresponding to one of said extended surfaces to provide a comparable plurality of repetitively curved segments in said film;

II. applying a first and second continuous long, thin, narrow, flexible conductive electrode in a surface-to-surface contact with respective sides of poled piezoelectric layer and coextensive therewith;

III. adhering to said first extended surface in at least a plurality of positions a long, narrow layer of flexible resilient material having first and second extended surfaces, with said first extended surface of said resilient material in contact with the second conductive electrode along substantially the entire length thereof; and IV. applying one or more adhesive portions coextensive with at least a portion of said second extended surface of said resilient material.

2. The method of claim 1, wherein said first and second electrodes have longitudinal conductors along one edge.

3. The method according to claim 1 wherein said one or more adhesive portions form an essentially continuous adhesive layer on the second extended surface of said resilient form material.

4. The method of claim 1 wherein said adhesive portions comprise pressure sensitive adhesive.

5. The method of claim 1 wherein said repetitively curved elements are provided by a multiplicity of closely packed balls in a single layer.

6. The method according to claim 5 wherein said balls are retained on a porous platen.

7. The method of claim 1 wherein said heat-forming step also includes the step of reducing the pressure on the side of said film material adjacent said curved elements.

* * * * *